(12) United States Patent
Feierbach

(10) Patent No.: US 6,370,612 B2
(45) Date of Patent: *Apr. 9, 2002

(54) ADAPTIVE MEMORY CONTROL

(75) Inventor: Gary F. Feierbach, Belmont, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/788,114

(22) Filed: Feb. 16, 2001

Related U.S. Application Data

(63) Continuation of application No. 09/107,254, filed on Jun. 30, 1998.

(51) Int. Cl.$^7$ .............................................. G06F 12/00
(52) U.S. Cl. ..................................................... 711/106
(58) Field of Search ........................... 365/222; 711/106

(56) References Cited

U.S. PATENT DOCUMENTS 4,423,380 A * 12/1983 Pileri ........................ 365/222
5,321,661 A * 6/1994 Iwakira et al. ............. 365/222

* cited by examiner

Primary Examiner—Jack A. Lane
(74) Attorney, Agent, or Firm—Pennie & Edmonds LLP

(57) ABSTRACT

An adaptive memory control determines optimal values for the refresh period and row and column address strobe signal frequency of an associated DRAM. A binary test pattern is written to the DRAM array, read during a subsequent read operation, and then compared to the original test pattern. If a match, the 1's complement of the test pattern is written to the array and then compared as described above with the original 1's complement pattern. If a match, the process is repeated using a more aggressive value for the desired parameter, i.e., refresh period, strobe frequency, etc. If at any point the comparison does not result in a match, a more conservative parameter value is used for the subsequent write, read, and compare sequence. This process continues until an optimal value for each desired parameter is determined.

15 Claims, 3 Drawing Sheets

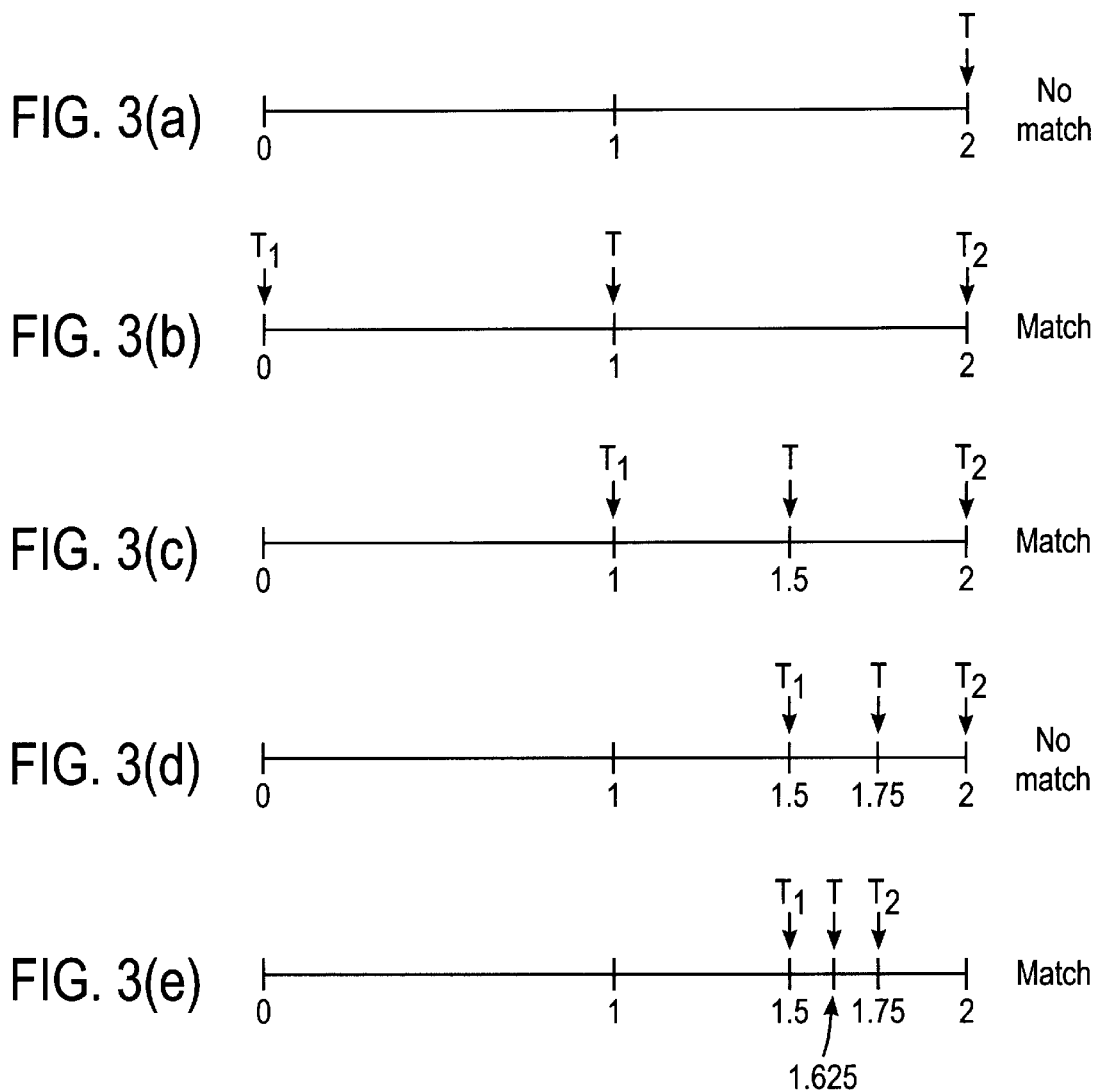

ADAPTIVE MEMORY CONTROL

This application is a continuation of U.S. patent application Ser. No. 09/107,254, filed Jun. 30, 1998.

BACKGROUND

1. Field of Invention

The present invention relates generally to semiconductor memories and particularly to controlling a DRAM array.

2. Description of Related Art

Dynamic RAM (DRAM) is presently used as the main memory of most computer systems and accounts for more than half of the global semiconductor memory market. DRAM operates at a much lower frequency than do modern microprocessors, and therefore limits the throughput of such microprocessors. Although SRAM is much faster than DRAM, the high cost of SRAM precludes its use as the main memory of a computer system. Accordingly, there is a need to increase the speed of DRAMs so as to close the gap between DRAM and microprocessor speeds.

FIG. 1 shows a system 1 having a conventional DRAM 10 and an associated memory controller 20. The DRAM 10 includes a DRAM cell array 11, a row decoder 12, latches 13, and a multiplexer (column decoder) 14. The memory controller 20 includes an address queue 21, registers 22, a strobe control circuit 23, and a refresh circuit 24. When the DRAM 10 and associated controller 20 are powered up, frequency values for the row address strobe and column address strobe, as well as the period for refresh operations, are loaded into registers 22 from a ROM BIOS 30. The DRAM 10 is accessed by an associated central processing unit (CPU) 40 via the controller 20. The CPU 40 provides input addresses specifying the location of a cell desired to be read from or written to on input address pins A[0:n]. The addresses are then queued in the address queue 21. The row address of a selected cell is forwarded to the row decoder 12 on the falling edge of the row address strobe ($\overline{RAS}$) signal. The contents of all cells within the row specified by the row address are latched into corresponding latches 13. The column address of the selected cell is forwarded to the multiplexer 14 on the falling edge of a column address strobe ($\overline{CAS}$) signal. The multiplexer 14 selects latches 13 corresponding to the cell identified by the column address. During a read operation, the latch values are provided as output on data pins D[0:n]. During a write operation, input data provided on the data pins D[0:n] is written to the selected latches 13. The row of data stored in the latches 13 is subsequently written back to the selected row of cells in the array 11 during a well known refresh operation via the refresh circuit 24.

The $\overline{RAS}$ and $\overline{CAS}$ signals are generated by the strobe control circuit 23 according to a system clock residing therein. Frequency values for the $\overline{RAS}$ and $\overline{CAS}$ signals, as well as the interval between refresh operations, i.e., the refresh period, are forwarded from the ROM BIOS 30 to the memory controller 20 upon power up and thereafter stored in the registers 22, as mentioned above. The default $\overline{RAS}$ and $\overline{CAS}$ signal frequencies and the refresh period stored within the ROM BIOS 30 are typically conservative so as to avoid charge loss in the DRAM cells and to ensure proper timing. Thus, although ensuring safe DRAM operation, these default frequency values do not result in optimum DRAM performance. For instance, while most DRAMs are specified to refresh the cells approximately every 20 ms, as directed by their ROM BIOS chips, the capacitor cells of the DRAM array may retain charge for up to 2 seconds, perhaps longer. Refreshing the cells more frequently than necessary for proper operation, i.e., every 20 ms as opposed to every 2 seconds, not only results in unnecessary power consumption but also unnecessarily consumes valuable clock cycles. Accordingly, using conservative, static values for the refresh period and for the frequency of the $\overline{RAS}$ and $\overline{CAS}$ signals undesirably limits DRAM performance.

SUMMARY

An apparatus and method are disclosed which greatly enhance DRAM operation. In accordance with the present invention, an adaptive memory control technique determines optimal values for certain DRAM parameters such as, for instance, the refresh period and for the row and column address strobe signal frequency. Default values for all but a selected one of the DRAM parameters are provided to the DRAM's memory controller, and an aggressive value for the selected parameters is provided to the memory controller. A binary test pattern is written to the DRAM array, read during a subsequent read operation following a refresh operation, and then compared to the original test pattern. If there is a match, the 1's complement of the test pattern is written to the array and then compared with the original 1's complement pattern as described above. If there is a match, the process is repeated using a more aggressive value for the refresh period. Conversely, if at any point the above-described comparison does not result in a match, a more conservative refresh period is used. Thus, the optimal value for the selected parameter is homed in on with each write, read, and compare sequence. Once the optimal value for the selected parameter is determined, the above-described process may be used to determine the optimal value for another DRAM parameter, e.g., the row and column address strobe frequency.

BRIEF DESCRIPTION OF THE DRAWINGS

FIGS. 3(a)–3(e) are a timing diagrams illustrating the operation of FIG. 2.

Like components in the Figures are similarly labeled.

DETAILED DESCRIPTION

Figure 1:
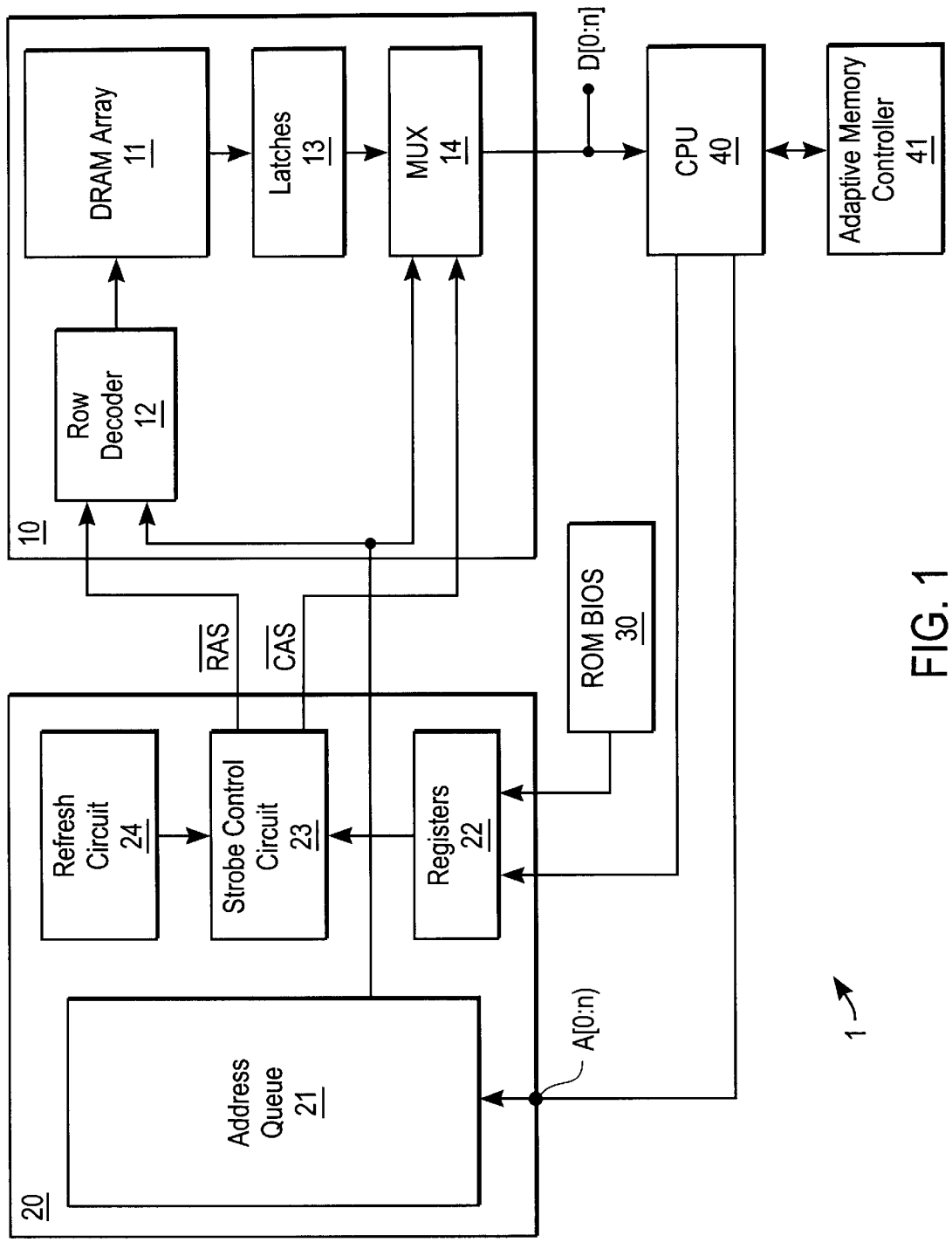
FIG. 1 is a block diagram of a system having a conventional DRAM and an associated memory controller.

Principles of the present invention are described below with reference to the system of FIG. 1 for simplicity only. It is to be understood that embodiments of the present invention may be used to optimize any type of memory which uses a refresh operation or which latches memory addresses using row and column address strobe signals, i.e., $\overline{RAS}$ and $\overline{CAS}$ signals. Accordingly, the present invention is not to be construed as limited to the specific examples provided herein.

Embodiments of the present invention provide dynamic values for the refresh period and $\overline{RAS}$ and $\overline{CAS}$ signal frequency in order to optimize performance of the DRAM 10. In a preferred embodiment, an adaptive memory control program 41 is formed as part of the CPU 40 or is stored in a memory accessible by the CPU 40. Preferably, the program 41 is stored in read-only memory. The program is executed by the CPU 40 to generate the dynamic values for the refresh period and $\overline{RAS}$ and $\overline{CAS}$ signal frequency, as described below with respect to the flow chart of FIG. 2. When the DRAM 10 is powered up, the CPU 40 provides to the registers 22 conservative default values for the $\overline{RAS}$ and $\overline{CAS}$ signal frequency and an aggressive value for the refresh period. Complementary test patterns are written to the cell array 11 according to these default values, read to the DRAM's data pins during a subsequent read operation following a refresh cycle, and then compared to the original test patterns.

If the binary states read from the cell array 11 match the original test patterns, the DRAM 10 is operating properly and the above process is repeated using a more aggressive value for the refresh period. Conversely, if there is not a match, the DRAM 10 is not operating properly and the process is repeated using a more conservative value for the refresh period. Operation continues in this manner until a desired resolution for the refresh period is achieved, thereby resulting in an optimum value for the refresh period. This process may then be repeated for a different parameter value.

Figure 2:
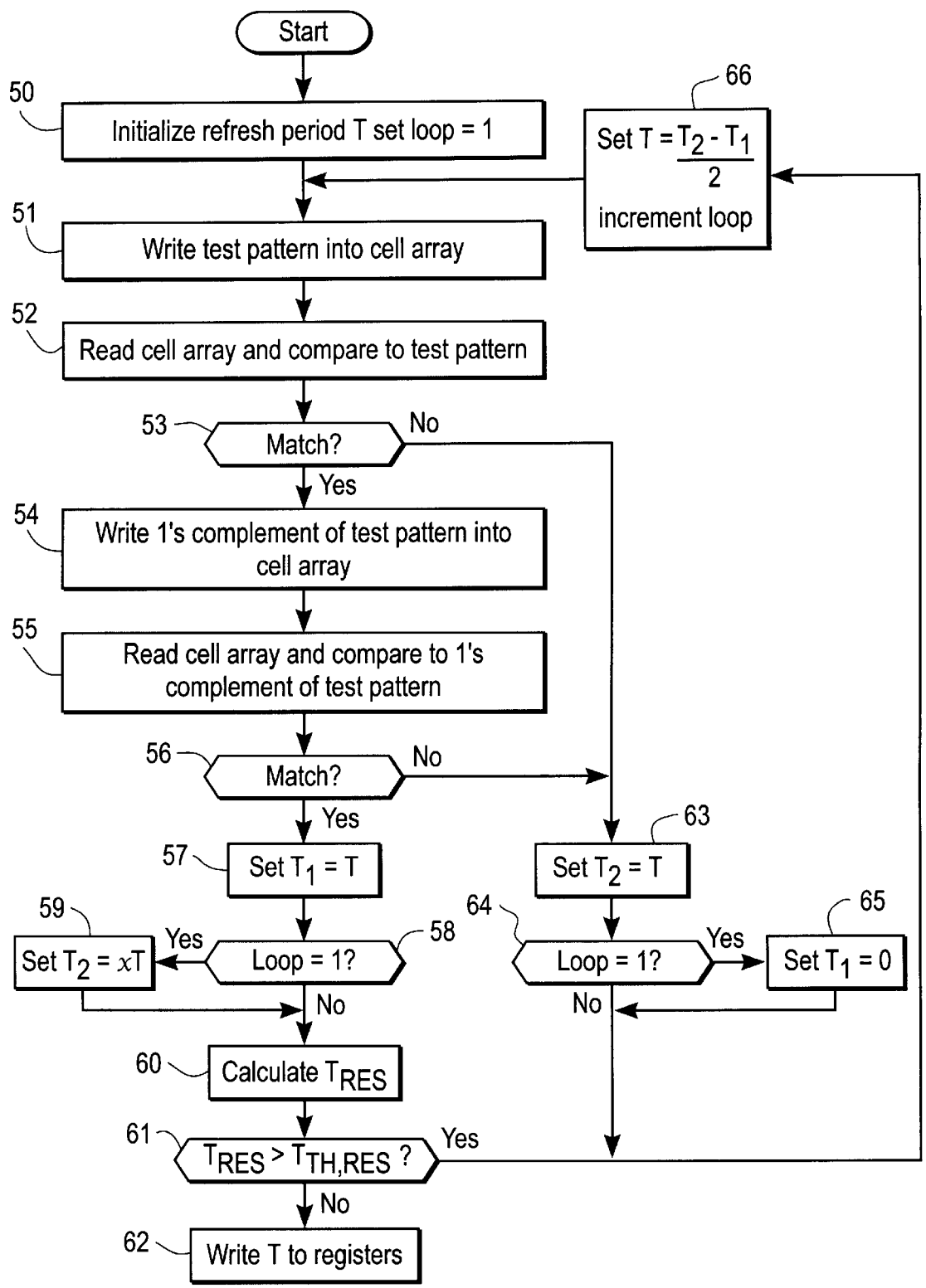
FIG. 2 is a flow chart illustrating operation of an embodiment of the present invention.

For instance, referring to FIG. 2, where it is estimated that the capacitors used in the DRAM cell array 11 retain sufficient charge to represent binary states therein for about 2 seconds, the CPU 40 initializes the refresh period T to 2 seconds and provides this value to the registers 22. The strobe signal frequency is initially set to a conservative default value. The value L of a loop counter resident in the CPU 40 is initialized to one (step 50). The CPU 40 forwards a binary test pattern of, for instance, all 1's, to the input address pins A[0:n]. The test pattern is then written to each row of the cell array 11 in a conventional manner using the initial strobe frequency value, whereby the cell array 11 is refreshed every T=2 seconds (step 51). The resultant binary states of the cells of the DRAM array 11 are provided on the data pins D[0:n] during subsequent read operations (step 52) and thereafter compared with the original binary test pattern via the CPU 40 (step 53). The comparison is performed, for instance, in a conventional manner using arithmetic logic units (ALUs) within the CPU 40.

If the resultant binary states read from the cell array 11 match the binary test pattern stored in the CPU 40, thereby indicating that the cell capacitors of the array 11 are able to retain the binary value "1" for at least T seconds, the CPU 40 generates the 1's complement of the original binary test pattern, i.e., all 0's (step 54). The 1's complement test pattern is written to the DRAM array 11 as explained earlier. The resultant binary states of the cells in the array 11 are then read and compared with the original 1's complement test pattern in the manner as described above (step 55).

If the binary states of the cell array 11 match the complement test pattern (step 56), thereby indicating that the cell capacitors of the array 11 are able to retain the binary value "0" for at least T seconds, the CPU 40 initializes a lower refresh period limit $T_1$ to the current refresh period value T, i.e., $T_1$=T (step 57). It is then determined if this is the first loop (step 58). If so, the CPU 40 initializes an upper refresh period limit $T_2$ to some multiple of the current refresh period value T, i.e., $T_2$=xT, where x>1 (step 59). The CPU 40 then calculates the difference between the upper and lower period limits, i.e., $T_{RES}=T_2-T_1$ (step 60) and determines if the desired resolution $T_{RES}$ has been achieved (step 61). If the desired resolution is less than a predetermined resolution threshold $T_{TH,RES}$, the present value of the period T is forwarded to the registers 22 and thereafter used as the refresh period (step 62). A resolution increment may be added to provide a wider operating margin.

If either of the above comparisons does not result in a match, thereby indicating that the cell capacitors of the array 11 do not sufficiently retain charge to preserve data therein for T seconds, the CPU 40 sets the upper limit $T_2$ to the current period T, i.e., $T_2$=T (step 63). If this is the first loop, i.e., if L=1 (step 64), the CPU 40 sets the lower limit $T_1$ to 0 (step 65). Otherwise, operation continues as described below.

The CPU 40 calculates new refresh period values T by splitting the difference between the upper and lower refresh period limits, i.e., T(new) =$(T_2-T_1)/2$, and increments the loop counter value L (step 66). The above-described steps are then repeated using the new value for the refresh period T, and operation continues until a resolution less than the predetermined resolution is achieved, i.e., until $T_{RES}=T_2-T_1<T_{TH,RES}$. In this manner, the CPU 40 homes in on an optimum refresh period value T for the DRAM array 11. An increment may be added to the optimum refresh period value to provide a wider operating margin.

Embodiments of the present invention are perhaps better understood in light of an example. Accordingly, an example will be provided in connection with FIGS. 2 and 3(a)–3(e). Referring to FIG. 2, assume the default refresh period T provided by the CPU 40 is 2 seconds, and the desired refresh period resolution $T_{TH,RES}$ is 0.15 seconds. Further, assume that the cell capacitors used in the DRAM array 11 actually retain data or charge for about $T_{CHARGE}$=1.65 seconds. Complementary test patterns are written to the DRAM array 11 and then compared with the resultant binary states of the cells (steps 51–56), as described above. Here, the comparisons would not result in a match, as shown in FIG. 3(a), since the cells retain data for 1.65 seconds, while the refresh period value T is set to 2 seconds. Thus, the CPU 40 sets the upper limit $T_2$=2 seconds (step 63) and, since this is the first loop, sets the lower limit $T_1$=0 (step 65). The CPU 40 calculates a new value of T=$(T_2-T_1)/2$=(2−0)/2=1 second (step 66).

The next write, read, and compare sequence (steps 51–56) in accordance with the present invention results in a match, as shown in FIG. 3(b), since the DRAM cells retain charge for more than the current refresh period, i.e., $T_{CHARGE}$= 1.65>T=1. Thus, the CPU 40 sets the lower limit $T_1$=T=1 (step 57), maintains the upper limit $T_2$ as before, i.e., 2 seconds, and then calculates the resolution $T_{RES}=T_2-T_1$=2− 1=1 (step 60). Since $T_{RES}$=1>$T_{TH,RES}$=0.15 (step 61), the CPU 40 calculates a new value for the new refresh period value T=$(T_2+T_1)/2$=(2+1)/2=1.5 seconds (step 66), and the above-described process is repeated using the new refresh period value T.

The next write, read, and compare sequence in accordance with the present invention (steps 51–56) results in a match, as shown in FIG. 3(c), since T=1.5 seconds<1.65 seconds. In response thereto, the CPU 40 sets the lower limit $T_1$=T=1.5 seconds (step 57), and calculates the resolution $T_{RES}=T_2-T_1$=2−1.5=0.5 seconds (step 60). Since $T_{RES}$=0.5>$T_{TH,RES}$= 0.15 (step 61), the CPU 40 calculates the new refresh period value T=$(T_2+T_1)/2$=(2+1.5)/2=1.75 seconds (step 66), and the above-described process is repeated using the new refresh period value T.

Now, the subsequent write, read, and compare sequence in accordance with the present invention (steps 51–56) does not result in a match, as shown in FIG. 3(d), since the current refresh period value T is greater than the time for which the DRAM capacitor cells are able to retain their charge, i.e., T=1.75>1.65. Accordingly, the CPU 40 sets the upper limit $T_2$=T=1.75 seconds (step 63), and calculates a new value for the refresh period T=$(T_2+T_1)/2$=(1.75+1.5)/2=1.625 seconds (step 66), and again repeats the write, read, and compare sequence (steps 51–56).

The next comparison results in a match, as shown in FIG. 3(e), since $T=1.625<T_{CHARGE}=1.65$. The CPU 40 sets the lower limit $T_1=T=1.625$ (step 57), and calculates the resolution $T_{RES}=T_2-T_1=1.75-1.625=0.125$ seconds (step 60). Here, the desired refresh period resolution has been achieved, i.e., $T_{RES}<T_{TH,RES}$ (step 61). Thus, the refresh period value T=1.625 seconds, or an incremented value to provide a wider operating margin, is stored into registers 22 and thereafter used as the refresh period for the DRAM 10, i.e., the DRAM cell array 11 is subsequently refreshed every 1.625 seconds (step 62).

As explained above, present embodiments maximize the interval between refresh operations without compromising data retention or validity. Thus, in accordance with present embodiments, the refresh period is a dynamic value that is adjusted upon every power up of the DRAM 10 according to the discharge rate of the cell capacitors in the DRAM array 11, as opposed to using static, default parameter values as taught by the prior art. Maximizing the refresh period results in fewer refresh operations per unit time and, therefore, reduces power consumption.

Further, reducing the number of refresh operations per unit time allows additional read and write operations to be performed in a given time period and, therefore, advantageously increasing throughput of the DRAM 10. For instance, in the example provided above, present embodiments increased the interval between refresh operations by several orders of magnitude, thereby resulting in a significant reduction in power consumption during refresh operations, as well as a significant improvement in throughput, as compared to conventional DRAM operation.

Moreover, present embodiments allow the CPU 40 to individually determine the optimal refresh period value for each bank of a multiple-bank DRAM. In this manner, each DRAM array bank has its own refresh period value T determined according to the capacitor discharge rates of cells within that bank. Refreshing each memory bank at its own optimal rate, independent of the refresh rates of the other memory banks, allows for optimization of the entire DRAM array. In contrast, conventional DRAM uses one refresh period T for all DRAM array banks, thereby limiting performance of the entire DRAM to the worst-case array bank.

The above process may also be used to determine an optimal row and column address strobe frequency. The CPU 40 initializes the strobe frequency value $f_{STROBE}$ to an aggressive value. The refresh period value T is either set to a default value or to the optimal value determined as described above. Complementary test patterns are written into the DRAM cell array 11, after which the resultant binary states of the cell array 11 are read and compared with the complementary test patterns, as described above. If there is a match, the CPU 40 increases the frequency value $f_{STROBE}$ in the manner described above. Conversely, if there is not a match, the CPU 40 decreases the frequency value $f_{STROBE}$ as described above. This sequence is repeated until an optimal strobe frequency $f_{STROBE}$ is determined.

Those skilled in the art will appreciate that the techniques of the invention may be used in connection with other DRAM signals.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claim is:

1. A memory control system for optimizing a parameter value for a RAM cell array, said memory control system comprising:
   a memory controller storing an adaptive memory control program; and
   a central processing unit coupled to said RAM cell array and to said memory controller for executing said adaptive memory control program;
   said adaptive memory control program comprising instructions for:
   (a) initializing said parameter value to a first predetermined value, wherein said first predetermined value is a refresh period of said cell array;
   (b) generating a test bit pattern;
   (c) writing said test bit pattern into said cell array using said parameter value;
   (d) reading binary states of said cell array after a refresh cycle;
   (e) comparing said binary states of said cell array with said test pattern; and
   (f) adjusting said parameter value by:
      decreasing said parameter value when there is no match between said binary states of said cell array and said test pattern by setting an upper parameter limit equal to said parameter value, setting a lower parameter limit equal to a second predetermined value which is less than said parameter value and changing said parameter value to equal an average of said upper and lower parameter limits;
      increasing said parameter value when there is a match between said binary states of said cell array and said test pattern by setting said upper parameter limit equal to an upper value greater than said parameter value, setting said lower parameter equal to said parameter value and changing said parameter value to equal an average of said upper and lower parameter limits.

2. The system of claim 1, wherein said parameter value is an address strobe frequency corresponding to said refresh period.

3. The system of claim 1, where said test bit pattern comprises first and second bit patterns, said second bit pattern being a 1's compliment of said first bit pattern.

4. The system of claim 1, wherein said adaptive memory control program further comprising instructions for:
   (g) generating a parameter resolution be taking the difference between said upper and lower parameter limits; and
   (h) repeating (c)–(g) until said parameter resolution is less than a predetermined resolution threshold.

5. The system of claim 1, wherein said first predetermined value is zero.

6. The method of claim 5, wherein said upper value is obtained by multiplying said parameter value with a third predetermined value x, where x>1.

7. A computer program product for controlling a parameter value of a RAM cell array in conjunction with a computer system, the computer program product comprising a computer readable storage medium and a computer program mechanism embedded therein, the computer program mechanism comprising instructions for:
   (a) initializing said parameter value to a first predetermined value, wherein said first predetermined value is a refresh period of said cell array;
   (b) generating a test bit pattern;

(c) writing said test bit pattern into said cell array using said parameter value;

(d) reading binary states of said cell array resulting from said writing step after a refresh cycle;

(e) comparing said binary states of said cell array with said test pattern; and (f) adjusting said parameter value by:

decreasing said parameter value when there is no match between said binary states of said cell array and said test pattern by setting an upper parameter limit equal to said parameter value, setting a lower parameter limit equal to a second predetermined value which is less than said parameter value and changing said parameter value to equal an average of said upper and lower parameter limits;

increasing said parameter value when there is a match between said binary states if said cell array and said test pattern by setting said upper parameter limit equal to an upper value greater than said parameter value, setting said lower parameter limit equal to said parameter value and changing said parameter value to equal an average of said upper and lower parameter limits.

8. The computer program product of claim 7, wherein said parameter value is an address strobe frequency corresponding to said refresh period.

9. The computer program product of claim 7, where said test bit pattern comprises first and second bit patterns, said second bit pattern being a 1's compliment of said first bit pattern.

10. The computer program product of claim 7, wherein the computer program mechanism further comprising instructions for:

(g) generating a parameter resolution by taking the difference between said upper and lower parameter limits; and (h) repeating (c)–(g) until said parameter resolution is less than a predetermined resolution threshold.

11. The computer program product of claim 7, wherein said first predetermined value is zero.

12. The method of claim 11, wherein said upper value is obtained by multiplying said parameter value with a third predetermined value x, where x>1.

13. A method for optimizing a parameter value of a RAM cell array, said method comprising:

(a) initializing said parameter value to a first predetermined value, wherein said first predetermined value is a refresh period of said cell array;

(b) generating a test bit pattern;

(c) writing said test bit pattern into said cell array using said parameter value;

(d) reading binary states of said cell array resulting from said writing step after a refresh cycle;

(e) comparing said binary states of said cell array with said test pattern;

(f) adjusting said parameter value by:

increasing said parameter value when said comparing step results in a match;

decreasing said parameter value when said comparing step does not result in a match;

and repeating (c)–(f) until a predefined stop condition is reached.

14. A memory control system for optimizing a parameter value for a RAM cell array, said memory control system comprising:

a memory controller storing an adaptive memory control program; and a central processing unit coupled to said RAM cell array and to said memory controller for executing said adaptive memory control program;

said adaptive memory control program comprising instructions for:

(a) initializing said parameter value to a first predetermined value, wherein said first predetermined value is a refresh period of said cell array;

(b) generating a test bit pattern;

(c) writing said test bit pattern into said cell array using said parameter value;

(d) reading binary states of said cell array resulting from said writing step after a refresh cycle;

(e) comparing said binary states of said cell array with said test pattern;

(f) adjusting said parameter value by:

increasing said parameter value when there is a match between said binary states of said cell array and said test pattern;

decreasing said parameter value when there is no match between said binary states of said cell array and said test pattern; and (g) repeating (c)–(f) until a predefined stop condition is reached.

15. A computer program product for controlling a parameter value of a RAM cell array in conjunction with a computer system, the computer program product comprising a computer readable storage medium and a computer program mechanism embedded therein, the computer program mechanism comprising instructions for:

(a) initializing said parameter value to a first predetermined value, wherein said first predetermined value is a refresh period of said cell array;

(b) generating a test bit pattern;

(c) writing said test bit pattern into said cell array using said parameter value;

(d) reading binary states of said cell array resulting from said writing step after a refresh cycle;

(e) comparing said binary states of said cell array with said test pattern;

(f) adjusting said parameter value by:

increasing said parameter value when there is a match between said binary states of said cell array and said test pattern;

decreasing said parameter value when there is no match between said binary states of said cell array and said test pattern; and (g) repeating (c)–(f) until a predefined stop condition is reached.

* * * * *